United States Patent [19]

Fromson et al.

[11] 4,334,769

[45] Jun. 15, 1982

[54] APPARATUS FOR MAKING A LITHOGRAPHIC PRINTING PLATE WITH REINFORCED IMAGE

[75] Inventors: Howard A. Fromson, 15 Rogues Ridge Rd., Weston, Conn. 06880; Robert F. Gracia, Scituate, Mass.

[73] Assignee: Howard A. Fromson, Weston, Conn.

[21] Appl. No.: 142,519

[22] Filed: Apr. 21, 1980

Related U.S. Application Data

[63] Continuation-in-part of Ser. No. 972,561, Dec. 22, 1978, abandoned.

[51] Int. Cl.³ .................... G03F 7/08; G03B 27/30; B41M 5/00
[52] U.S. Cl. .................................. 355/100; 101/467; 430/156
[58] Field of Search ............... 354/297, 354, 317, 323; 430/155, 156; 355/125, 100, 132, 133, 85, 78; 101/466, 467, 471, 472, 453, 450.1, 463.1

[56] References Cited

U.S. PATENT DOCUMENTS

| | | | |
|---|---|---|---|
| 3,145,104 | 8/1964 | Oster et al. | 101/467 X |
| 3,520,606 | 7/1970 | Gush et al. | 355/85 |
| 3,682,636 | 8/1972 | Krueger | 101/463.1 X |
| 3,905,815 | 9/1975 | Bonham | 430/156 |
| 3,936,853 | 2/1976 | Mart | 354/317 X |
| 3,981,583 | 9/1976 | Tsuchida et al. | 355/100 |
| 4,020,762 | 5/1977 | Peterson | 101/471 X |
| 4,038,253 | 7/1977 | Kramer | 101/453 X |
| 4,042,613 | 8/1977 | Takamizawa et al. | 101/463.1 X |
| 4,232,105 | 11/1980 | Shinohara et al. | 430/155 X |

*Primary Examiner*—Donald A. Griffin
*Attorney, Agent, or Firm*—Felfe & Lynch

[57] ABSTRACT

Lithographic printing plates are made by exposing to actinic light a lithographic plate having a water soluble light sensitive layer thereon to form an image in said layer. A solvent soluble, UV curable material is adhered to the image in said layer. The plate is developed before or after applying the UV curable material. The plate is exposed to UV source having an intensity greater than the imaging light to form a press-ready plate having a durable, reinforced cured image thereon.

4 Claims, 1 Drawing Figure

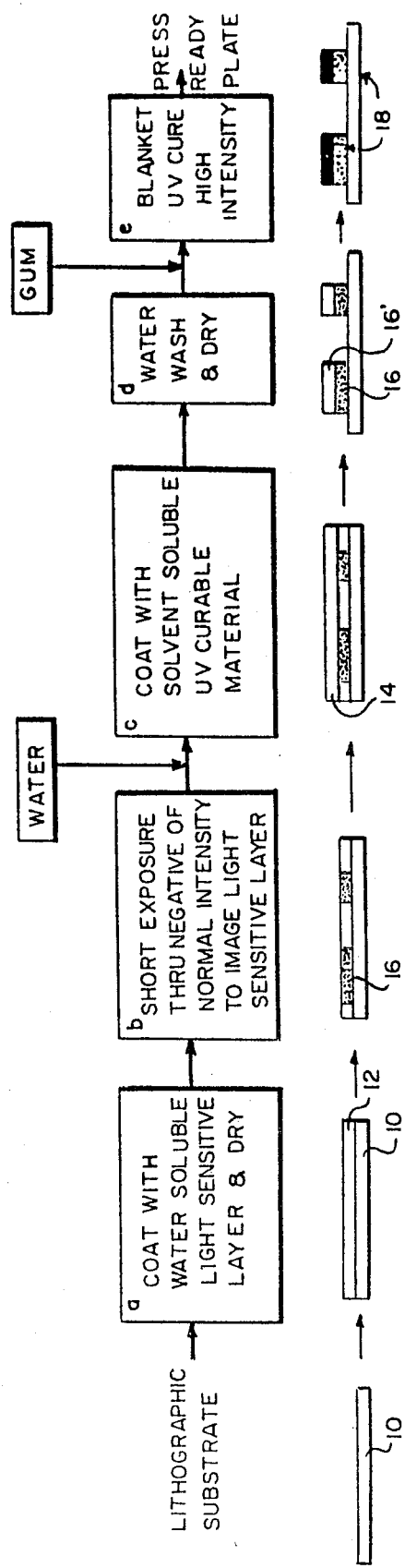

APPARATUS FOR MAKING A LITHOGRAPHIC PRINTING PLATE WITH REINFORCED IMAGE

RELATED APPLICATION

This application is a continuation-in-part of copending application Ser. No. 972,561, filed Dec. 22, 1978, now abandoned.

BACKGROUND

This invention relates to a process and apparatus for making press-ready lithographic printing plates having a durable, reinforced, cured image thereon wherein the image is formed and reinforced in two separate exposure steps, the first to form the image, and the second to cure or cross link the image.

Lithographic printing techniques, using, for example, anodized and silicated aluminum base plates such as described in Fromson U.S. Pat. No. 3,181,461 issued May 4, 1965, have come into widespread use in the printing industry and especially in offset printing and direct lithographic printing by newspapers using converted letterpress printing presses.

A conventional negative working lithographic printing plate of this type has a coating of a light sensitive substance that is adherent to the aluminum base sheet after exposure. If the light sensitive coating is applied to the base sheet by the manufacturer, the sheet is referred to as a "presensitized plate". If the light sensitive substance is applied to the base by the lithographer or trade plate maker, the plate is referred to as a "wipe-on plate". Depending on the nature of the photosensitive coating employed, a coated plate may be utilized to reproduce directly the image to which it is exposed, in which case it is termed a positive-acting plate, or to produce an image complementary to the one to which it is exposed, in which case it is termed a negative acting plate. In either case, the image area of the developed plate is oleophilic and the nonimage area is hydrophilic.

In the case of a negative working plate, the surface is coated with an aqueous solution of a conventional diazo resin. The plate is dried and exposed through a negative. The exposed image areas become water insoluble and the unexposed non-image areas remain water soluble. The plate is conventionally developed with a lithographic lacquer which consists of a two-phase system, one phase containing an oleophilic resin and the other phase a hydrophilic gum. Upon application, the oleophilic resin adheres to the exposed insoluble areas, while the hydrophilic phase dissolves away the unexposed soluble non-image areas. In this way, the image areas are made oleophilic or ink receptive and the non-image areas are made hydrophilic or ink repellent.

The use of a lithographic lacquer as described above represents one way of reinforcing an image on a lithographic printing plate. Other ways have been sought to reinforce the image to make it more durable and increase the press-life of the plate. For example, in Fromson U.S. Pat. No. 3,773,514, a tough, wear-resistant solvent insoluble protective layer is applied to the light sensitive coating before imaging and developing the plate.

Another proposal is set forth by Adams et al. In U.S. Pat. No. 3,669,664 wherein a fully exposed image on a developed lithographic plate is reinforced by treating the developed plate with a lacquer made of a dispersion in water of a solution of a photopolymerizable resin in an organic solvent. The treated image can be further strengthened by exposure to actinic light and/or heat. This approach, however, is time consuming and cumbersome because it starts with a conventionally exposed and developed lithographic plate. This is an additional procedure which in fact lengthens the time required for making a press-ready plate. In the case of lithographic printing of newspapers where speed and efficiency is a critical factor this approach has serious drawbacks.

Another proposal is set forth by Bonham in U.S. Pat. No. 3,905,815 wherein a base sheet is provided with a coating of a diazo resin over which is provided a photopolymerizable layer. The latter is designed such that, for a given exposure, its rate of polymerization and insolubilization is at least as great as the rate of insolubilization of the diazo resin layer. This requires precise matching of the characteristics of the two layers and image formation and curing are carried out during exposure of the dual coated base sheet through a negative. This provides no advantage over a conventional diazo coated lithographic substrate from the standpoint of increasing the efficiency of the plate making operation.

SUMMARY

The present invention provides a method for two-stage imaging and curing of lithographic plates which are characterized by a substrate coated with a first layer of water soluble light sensitive material which when exposed to light will adhere to the substrate and a second overlying layer of a solvent soluble UV curable material which is capable of being cured by UV light having an intensity substantially greater than the light required to image the water soluble light sensitive layer.

Thus, in one embodiment, the process of the invention includes the steps of:

(1) exposing to actinic light through a lithographic plate having a water soluble light sensitive layer thereon to form at least a latent image in the layer;

(2) applying a solvent soluble, UV curing material to the imaged plate from step (1);

(3) applying water to the plate from step (1) to remove the light sensitive layer and UV curable material in the non-image areas leaving UV curable material adhered to the image in the light sensitive layer; and (4) exposing the plate from step (3) to a UV source having an intensity greater, preferably ten times greater, than the imaging light used in step (1) which is sufficient to cure the UV material adhered to the image to form a press-ready plate having a durable, reinforced, cured image thereon.

Alternatively, the non-image areas of the image plate from step (1) are removed prior to step (2), preferably employing the chemical amplification technique described in copending application Ser. No. 064,322, filed Aug. 6, 1979 (case 286). In this instance, steps (2) and (3) can be combined to adhere the UV material to the developed image in the light sensitive layer.

It is preferred that the intensity and duration of the exposure in step (1) be sufficient to form a latent image in the light sensitive layer. Latent image means the following: under normal conditions a diazo-coated plate must be exposed for a minimum period of time. The exposure time is such that a proper balance of image quality and image adhesion or toughness is achieved. Traditionally the proper exposure time is arrived at by using a Stauffer-Gray Scale. This is a 21-step scale which increases in grayness linearly from zero to 3 as measured by a densitometer. The optimum reading on this scale which gives best results for most lithographic printing plates is a solid step 6 or a 7 showing on the scale after development with conventional light sources, i.e., carbonarc, zenon, mercury vapor. The time value for proper exposure is between 60 and 120 seconds depending on the light source. In this invention, the exposure time for a diazo-coated plate (coated at a constant ratio of one-half to one percent solution) is between one and ten seconds with these same conventional light sources. After exposure there is no visible image. The visible image does appear upon development. It is this invisible or ghost image which is referred to as a latent image. Upon development, an intense image results. Relative to a Stauffer Scale reading, the invention initially exposes to a solid step 1 or 2 which would be almost useless on other types of plates.

For example, when using a diazo resin for the light sensitive layer, the exposure through a negative need only be for a very short duration (5 to 10 seconds) which is sufficient to form the latent image. Under normal conditions in lithographic plate preparation, a diazo resin must be exposed to an intensity of actinic light long enough to form an oleophilic visible image which is lacquerable. This requires a much greater length of time in the order of minutes as compared to the seconds required to form a latent image according to the invention.

Apparatus of the invention for carrying out the process includes means for accomplishing the various steps outlined above, namely:

(1) A diazo-coated plate.
(2) Means for the first latent image exposure.
(3) Applicator means for the UV coating.
(4) Developing means to remove excess (non-image) diazo and UV resin.
(5) Means to rinse and optionally gum the plate.
(6) High intensity blanket UV exposure means to cure the reinforced image at speeds of 2 to 100 feet per minute.

Alternatively, means can be included to develop the plate after the image is formed and before the UV coating is applied. In this instance, the developing means functions to remove excess UV resin from the non-image areas of the earlier developed plate.

DESCRIPTION OF THE DRAWING

The present invention will be more fully understood from the following description taken in conjunction with the accompanying drawing:

The FIGURE is a flow diagram for carrying out one embodiment of the invention.

DESCRIPTION

Referring to the drawing, the embodiment illustrated involves coating a lithographic substrate 10 with a water soluble light sensitive layer 12 followed by drying (step (a)). The coated substrate 10 is then given a short exposure through a negative of normal intensity to form image 15. In step (c) in the flow diagram, the imaged substrate is coated with solvent soluble UV curable material 14. The intensity and duration of the exposure to form the latent image 16 in the light sensitive layer 12 is sufficient in a preferred embodiment to form only a latent image without curing the UV curable coating 14. The invention can also be carried out using an image intensity greater than needed to form the latent image.

Alternatively, water or other developer can be applied to the image plate after the exposure step to remove non-image areas in layer 12 before applying the solvent soluble UV curable material 14.

Following step (c), the plate is water developed which removes light sensitive layer 12 and the overlying UV curable material 14 in the non-image area leaving the imaged portion 16 of the light sensitive layer with the overlying portion 16' of the UV curable material.

Following the water wash step, an optional feature involves wiping or rubbing with a conventional hydrophilic gumming material to improve the hydrophilic properties of the plate. After this the imaged and developed plate is given a blanket exposure to a high intensity source of UV light which is sufficient to cure the UV material 16' to form a press-ready plate having a durable, reinforced cured image 18 thereon. The UV exposure in step (e) is of an intensity which is at least twice as great as the intensity used for the exposure in step (c). Rubbing with a gumming material can also follow step (e) rather than after or in addition to the water wash step.

In most cases, the image forming step through a negative will require an exposure of conventional intensity—e.g., 1–10 watts/in$^2$ for 1 to 10 or more seconds. Generally, the blanket UV curing step uses a UV source that delivers 50–500 watts/in$^2$. Generally, the UV curing step can be carried out in a matter of seconds, e.g., from 0.1 to 5 seconds. The UV curable material is not cured or crosslinked by the actinic light used in the image forming step. This criteria applies in all embodiments of the invention.

The several embodiments of the invention can be described as follows with reference to the preferred use of a water soluble diazo resin for the light sensitive layer 12.

1. A water-soluble dried diazo sensitized plate is exposed to actinic light long enough to form a latent image and is then overcoated either by roller coating, spraying or other techniques with a film of a solvent UV curable resin. While the plate is still moist, it is wiped or rubbed with water or preferably a dilute solution of gum arabic or equivalent to wipe away the resin in the non-image areas but leave the UV resin adhered to the image areas of the diazo resin. Post-curing the now adhered but uncured UV resin with a high intensity source of UV light provides a press-ready plate having a durable reinforced cured image thereon.

2. This embodiment is similar to the embodiment described under (1) above and involves applying water or other developer to the imaged plate after the initial exposure to remove non-image areas in layer 12 prior to applying a solvent soluble UV curable resin to the imaged and developed plate. In addition to water, a dilute gum solution can be used. This causes the UV curable material to adhere only to the latent image in the light sensitive layer 12 which saves on the amount of material needed for making a plate. Other hydrophilic, water soluble materials can be used for the same purpose.

3. A water-soluble diazo sensitized plate is exposed to actinic light preferably at least long enough to form a latent image, and is then developed using a special developing lacquer consisting of either a solution of a UV curable resin in a solvent or an emulsion of a UV curable resin in a solvent plus gum arabic. When using the solution form, it is merely necessary to lightly spray or wet the exposed surface with the solution followed by a rubbing with a solution of gum arabic which wipes away the resin from the non-image area. The UV resin adheres strongly to the exposed diazo image without piling or build-up. Stated differently, the adhesion between the diazo image and the UV curable resin is such that the application of the lacquer results in a continuous coating which does not build up after the initial coating becomes adhered. When using the emulsion form, the exposed but undeveloped plate is simultaneously cleaned out in the nonimage areas while the UV curable resin is deposited and adhered to the image. Again, the UV curable resin becomes deposited without piling or build-up.

4. Actinic light from a laser is used to form a latent image. A YAG laser light source such as the Log-E machine by Log-E-Tronics, or an Argon-Ion light source such as the Laserite made by EOCOM, is preferred. The steps are the same as above.

The present invention offers the following advantages over the prior art.

By separating out the phase of forming the image from that of curing the image, four advantages are realized:

1. Speed—it is now possible to image the plate in as little as one or ten seconds as compared to a normal exposure on the order of 75 seconds or more for a diazo resin.

2. Run length—the UV curable material made up of monomers and/or oligomers is cured quickly under very powerful UV light source to form an extremely tough image. This results in a lithographic printing plate with a durable, long-lasting image capable of running on a press for 250,000 impressions or more.

3. Material savings—the invention results in substantial savings in paper waste, ink and lacquer because it minimizes plate changes as well as the time of preparation. The plate is extremely oleophilic and start-ups are extremely rapid.

4. Technological advantages—it is now possible for the first time to image an additive wipe-on plate with a laser and eliminate the need for negatives.

The invention also substantially eliminates the need for conventional development lacquers and their concomitant waste problems due to the presence of solvents, pigments and acids.

In a conventional diazo sensitized lithographic printing plate, the initial exposure not only images a plate but also cures the image which is required for durability on the press. The art uses a standard known as the Stouffer Gray Scale and it is generally recognized that an exposure producing a solid 6 is necessary to achieve the sufficient toughness and abrasion resistance in the final image on the plate. According to the present invention using a much shorter exposure for forming the latent image, it is possible with a solid 1 or 2 on the Stouffer scale to achieve the same results that normally are only achieved with a solid 6 or more on a conventional plate. The invention does not depend on the initial exposure for imparting toughness to the image and only seeks to form a latent image. This greatly reduces the time required because the duration of the exposure doubles for each step on the Stouffer scale. By using a solid 1 or 2 according to the invention (as compared to the normal solid 6) a substantial time savings is realized. Toughness is imparted to the image via the UV curable material which can be quickly cured with a high intensity UV source.

The lithographic substrate 10 can be a single sheet or a laminate and can be rigid or flexible. The substrate 10 may be a coated paper, a plastic film or sheet or a metallic sheet. The preferred lithographic substrate is anodized aluminum which may be pretreated before anodizing to roughen or grain the surface, for example using mechanical, chemical or electrochemical techniques as are well known in the art and it may be post-treated after anodizing, for example as described in Fromson U.S. Pat. No. 3,181,461.

The light sensitive coating 12 is preferably a water soluble diazo resin that is commercially available from a number of sources. Other light sensitive materials may be used provided they are water soluble and can be imaged to form a latent image using light of an intensity substantially less than the UV source required to cure the UV resin in the second phase of the invention. Typical light sensitive materials are described in Fromson U.S. Pat. No. 3,773,514 referred to previously.

UV curable materials suitable for use in the invention are commercially available from a number of sources in the form of UV curable inks, coatings, oligomers and monomers. Such commercially available materials can be obtained from the following companies: Inmont Corporation, Sinclair & Valentine, Celanese Chemical Company, 3-M Company, Desoto Chemical Company, Paulimer Industries, Shell Chemical, Mobile Chemical, WR Grace, Design Coat Company, and Ware Chemical Corporation.

UV curable materials including monomers and oligomers are described in the following patents:

U.S. Pat. No. 3,297,745: 1967
U.S. Pat. No. 3,380,381: 1968
U.S. Pat. No. 3,673,140: 1972
U.S. Pat. No. 3,770,643: 1972
U.S. Pat. No. 3,712,871: 1973
U.S. Pat. No. 3,804,736: 1974

There are also materials that will cure upon exposure to other sources of radiation, for example an electron beam. These curable materials can be used in special applications in the invention and are commercially available. Electron beam curable compositions are described in U.S. Pat. Nos. 3,586,526–30, 1971.

The present invention can be used to make printed circuits by using, in place of a lithographic substrate 10, a composite laminate comprising a base, a conductive layer such as copper and an overlying light sensitive layer 12. Exposure through a negative of a wiring diagram or the like (or exposure with a laser) forms an image in the desired conductive areas. The UV curable coating 14 is added after exposure as described above. After developing (which leaves the conductive layer bare in the non-conducting areas) and curing of the UV coating 14, the non-conductive areas are etched away in the usual fashion. UV curing can follow the etch steps and suitable overcoatings can be used after etching such as a further UV coating and cure.

The following examples are intended to illustrate the invention without limiting same.

EXAMPLE 1

A UV curable coating useful in this invention is prepared by mixing 20 parts of Ultra King Nova Blue Ink (Inmont Chemical Co.) with 80 parts of ethlene glycol diacetate. A brushed grained, anodized aluminum plate is coated with ½% solution of water soluble diazo resin (purchased from Fairmont Chemical Co.). The coating is dried and the plate is placed in a Nu-Arc exposure unit and exposed through a negative for ten seconds to form a latent image. After exposure a small amount of the UV coating described above is applied to a sponge and lightly applied to the exposed plate surface. Immediately an intense image becomes visible. When the plate is uniformly developed it is coated with a light coating of Gum Arabic (10%). The plate is then passed under a high intensity UV light source such as produced by PPG Industries (MOD-1 unit—200 to 300 watts). Upon exiting from the high intensity light source a very tough, abrasive resistant image is realized. The abrasive resistance is tested with a red rubber eraser or a Gardner washability machine. Relative to conventionally exposed and lacquered diazo plates-these coatings are extremely tough.

EXAMPLE 2

A two-phase emulsion of a UV curable coating is prepared in the following manner:

| Ink/Solvent | Gum Phase |
| --- | --- |
| 6 Parts Inmont Nova Blue UV Ink. | 50 Parts Gum Arabic (8° Be) |
| 10 Parts Span 80 (ICI Chemical Co.) | 10 Parts Pluronic (HLB 30 |
| 24 Parts Cellosolve Acetate | Pluronics made by BASF Corp.) |

The two phases prepared above are then mixed together with vigorous agitation. An aluminum plate diazo coated and exposed as described in Example 1 is then treated with this two-phase emulsion by lightly rubbing with a sponge, cloth, or pad. The plate is rinsed, dried, passed under the high intensity UV light source resulting in a very tough abrasive resistance offset plate image ready for press.

EXAMPLE 3

A UV curable coating is prepared as follows:

| | |
| --- | --- |
| 9 Parts | UVIMER #530 (an oligimer sold by Polychrome Corp.) |
| 1 Part | Trimethylol Propane Triacrylate (Ware Chemical Corp.) |
| 0.5 Parts | Benzophenone |
| 0.5 Parts | Dimethyl Aminoethenol |
| 89 Parts | Cellosolve Acetate |
| 100 Parts | Total |

This UV curable coating is applied to a diazo coated plate prepared and exposed as in Example 1. Abrasive tests performaned on this material using a Gardner washability machine are judged as excellent.

EXAMPLE 4

A UV curable coating designated X-437-90 purchased from Polymer Industries diluted with diethyleneglycol diacetate (10/90) is sprayed onto an aluminum plate diazo coated and exposed as in Example 1. After spraying, the material adheres tenaciously to the latent image and the background cleans up immediately when further sprayed with water. The plate is gummed, dried and cured under the high intensity UV source. Comparable results are obtained, that is, a high quality, tough image results.

EXAMPLE 5

Brushed grained, anodized, silicated aluminum plates coated with a ½% solution of diazo resin are placed in a Log-E Laser plate maker containing a YAG Laser. The plates are scanned in approximately two minutes then removed and treated with UV coating prepared as in Examples 1 and 2. The latent images produced by laser exposure are thus amplified to strong, intense images. After passage under the high intensity UV source of Example 1 a press ready plate, capable of 250,000 impressions is made.

EXAMPLE 6

A brush-grained aluminum sheet, silicated and anodized, is placed in the Log E laser (YAG) apparatus. A film mask produced by Scott Graphics is placed face down on the aluminum sheet. The mask/plate composite is scanned with the YAG laser using a newspaper positive as read material. A positive image is left on the aluminum sheet and a negative image remains in the mask due to ablation by the laser.

This image is not substantive to the substrate and must be reinforced. A selective coating such as that used in Example 1 is poured or coated onto the surface of the plate. The plate is rinsed, dried and exposed by a high intensity UV light source. The resulting selectively coated material is now very substantive and abrasion resistant.

What is claimed is:

1. Apparatus for making a lithographic printing plate which comprises in sequential combination:
   (a) means for exposing to actinic light a lithographic plate having a water soluble light sensitive coating thereon to form an image in said coating;
   (b) means for applying a solvent soluble UV curable material to the imaged plate from paragraph (a);
   (c) means for applying water to the plate from paragraph (b) to remove light sensitive coating and overlying UV curable material in the non-image areas leaving the UV curable material adhered to the image; and
   (d) means for exposing the plate from paragraph (c) to a UV source having an intensity greater than the imaging light means of paragraph (a) which is sufficient to cure the UV material.

2. Apparatus of claim 1 which includes means for coating a lithographic plate with a water-soluble, light sensitive material.

3. Apparatus of claim 1 wherein the means for exposing is a laser.

4. Apparatus for making a lithographic printing plate which comprises:
   (a) means for exposing to actinic light a lithographic plate having a water soluble light sensitive layer thereon to form an image in said layer;
   (b) means for removing the non-image areas of said layer from the exposed plate from paragraph (a);
   (c) means for applying a solvent soluble UV material to the image areas of the plate from paragraph (b); and
   (d) means for exposing the plate to a UV source having an intensity greater than the imaging light means of paragraph (a), said UV source having an intensity sufficient to cure the UV material to form a press-ready plate having a durable, reinforced cured image thereon.

* * * * *